(12) United States Patent
Kim et al.

(10) Patent No.: US 10,298,201 B2
(45) Date of Patent: May 21, 2019

(54) BULK ACOUSTIC WAVE RESONATOR AND METHOD FOR MANUFACTURING THE SAME

(71) Applicant: Samsung Electro-Mechanics Co., Ltd., Suwon-si (KR)

(72) Inventors: Tae Yoon Kim, Suwon-si (KR); Tae Kyung Lee, Suwon-si (KR); Moon Chul Lee, Suwon-si (KR); Sung Min Cho, Suwon-si (KR); Sang Kee Yoon, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 310 days.

(21) Appl. No.: 15/385,448

(22) Filed: Dec. 20, 2016

(65) Prior Publication Data

US 2017/0317660 A1 Nov. 2, 2017

(30) Foreign Application Priority Data

Apr. 27, 2016 (KR) .................. 10-2016-0051650

(51) Int. Cl.
*H03H 9/17* (2006.01)
*H03H 3/02* (2006.01)
*H03H 9/54* (2006.01)
*H03H 9/02* (2006.01)

(52) U.S. Cl.
CPC ............ *H03H 9/17* (2013.01); *H03H 3/02* (2013.01); *H03H 9/02133* (2013.01); *H03H 9/173* (2013.01); *H03H 9/54* (2013.01)

(58) Field of Classification Search
CPC ...... H03H 9/17; H03H 9/173; H03H 9/02133; H03H 9/54; H03H 3/02; H03H 9/172
See application file for complete search history.

(56) References Cited

U.S. PATENT DOCUMENTS

| 6,355,498 | B1 | 3/2002 | Chan et al. | |
|---|---|---|---|---|
| 2002/0189062 | A1* | 12/2002 | Lin | H03H 3/02 29/25.35 |
| 2005/0077803 | A1* | 4/2005 | Ha | H03H 3/02 310/324 |
| 2006/0202769 | A1* | 9/2006 | Nagao | H03H 3/02 331/73 |
| 2008/0081398 | A1 | 4/2008 | Lee et al. | |
| 2012/0218059 | A1* | 8/2012 | Burak | H03H 9/132 333/191 |
| 2013/0049545 | A1* | 2/2013 | Zou | H03H 3/04 310/346 |

FOREIGN PATENT DOCUMENTS

| JP | 2010-41153 A | 2/2010 |
|---|---|---|
| KR | 10-2004-0102390 A | 12/2004 |

* cited by examiner

*Primary Examiner* — Bryan P Gordon
(74) *Attorney, Agent, or Firm* — NSIP Law

(57) ABSTRACT

A bulk acoustic wave resonator may include: an air cavity; an etching stop layer and an etching stop part, which define a lower boundary surface and a side boundary surface of the air cavity; and a resonating part formed on an approximately planar surface, which is formed by a upper boundary surface of the air cavity and a top surface of the etching stop part. A width of a top surface of the etching stop part may be greater than a width of a bottom surface of the etching stop part. A side surface of the etching stop part connecting the top surface of the etching stop part to the bottom surface of the etching stop part may be inclined.

11 Claims, 11 Drawing Sheets

BULK ACOUSTIC WAVE RESONATOR AND METHOD FOR MANUFACTURING THE SAME

CROSS-REFERENCE TO RELATED APPLICATIONS

This application claims benefit under 35 USC 119(a) of Korean Patent Application No. 10-2016-0051650 filed on Apr. 27, 2016 in the Korean Intellectual Property Office, the entire disclosure of which is incorporated herein by reference for all purposes.

BACKGROUND

1. Field

The following description relates to a bulk acoustic wave resonator and a method for manufacturing a bulk acoustic wave resonator.

2. Description of Related Art

In accordance with the recently rapid development of mobile communications devices, chemical devices, and biological devices, the demand for compact and lightweight filters, oscillators, resonant elements, and acoustic resonant mass sensors has also increased.

Bulk acoustic resonators have been developed as a means for implementing compact and lightweight filters, oscillators, resonant elements, and acoustic resonant mass sensors. Bulk acoustic resonators have advantages in that they may be mass-produced at a minimal cost and may be subminiaturized. Further, bulk acoustic resonators have advantages in that they may implement a high quality Q factor, which is the main property of a filter, may be used even in a micro-frequency band, and may particularly implement a high quality Q factor up to bands used in a personal communications system (PCS) and a digital cordless system (DCS).

Bulk acoustic resonators may have a structure in which a resonating part is formed by a lower electrode, a piezoelectric layer, and an upper electrode which are sequentially stacked on a substrate. When an electric field is induced in the piezoelectric layer by applying electric energy to the lower electrode and the upper electrode, the electric field causes a piezoelectric phenomenon in the piezoelectric layer, thereby causing the resonating part to vibrate in a predetermined direction. As a result, an acoustic wave is generated in the same direction as the vibrational direction of the resonating part, thereby causing resonance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave resonator includes: an air cavity; an etching stop layer and an etching stop part, which define a lower boundary surface and a side boundary surface of the air cavity; and a resonating part formed on an approximately planar surface, which is formed by a upper boundary surface of the air cavity and a top surface of the etching stop part. A width of a top surface of the etching stop part is greater than a width of a bottom surface of the etching stop part. A side surface of the etching stop part connecting the top surface of the etching stop part to the bottom surface of the etching stop part is inclined.

The width of the bottom surface of the etching stop part may be 2 μm to 30 μm.

An angle formed by the bottom surface of the etching stop part and the side surface of the etching stop part may be 110° to 160°.

The bulk acoustic wave resonator may further include a sacrificial layer pattern which is disposed outside the etching stop part.

The bulk acoustic wave resonator may further include a membrane formed on the side surface and the bottom surface of the etching stop part, and on an upper boundary surface of the air cavity.

A thickness of the membrane may be less than a thickness of the air cavity.

The bulk acoustic wave resonator may further include a membrane formed on the top surface of the etching stop part, and on the upper boundary surface of the air cavity.

The etching stop layer and the etching stop part may be formed of a same material.

The resonating part may include a first electrode, a piezoelectric layer, and a second electrode, which are sequentially formed. The piezoelectric layer may include a rare earth metal.

The rare earth metal may include any one or any combination of any two or more of scandium (Sc), erbium (Er), yttrium (Y), and lanthanum (La).

The piezoelectric layer may include the rare earth metal in an amount of 1 to 20 at %.

In another general aspect, a method to manufacture a bulk acoustic wave resonator includes: sequentially forming an etching stop layer and a sacrificial layer on a substrate; forming a pattern in the sacrificial layer such that a portion of the etching stop layer is exposed by the pattern; forming an etching stop material on the portion of the etching stop layer exposed by the pattern and the sacrificial layer, so as to fill the pattern; planarizing the etching stop material; forming a resonating part on the sacrificial layer and a portion of the etching stop material remaining on the pattern after the planarizing; and forming an air cavity by removing a portion of the sacrificial layer disposed on an inside of the portion of the etching stop material remaining on the pattern.

A width of a top surface of the pattern may be greater than a width of a bottom surface of the pattern. A side surface of the pattern connecting the top surface of the pattern to the bottom surface of the pattern may be inclined.

A width of a bottom surface of the pattern may be 2 μm to 30 μm.

An angle formed by a bottom surface of the pattern and a side of the pattern may be 110° to 160°.

A thickness of a section of the etching stop material filled in the pattern may be greater than a thickness of the sacrificial layer.

The method may further include forming a membrane on the sacrificial layer and the portion of the etching stop layer externally exposed by the pattern, prior to the forming of the etching stop material.

The may further include forming a membrane on the sacrificial layer and the portion of the etching stop material remaining on the pattern after the planarizing.

Other features and aspects will be apparent from the following detailed description, the drawings, and the claims.

Figure 1:
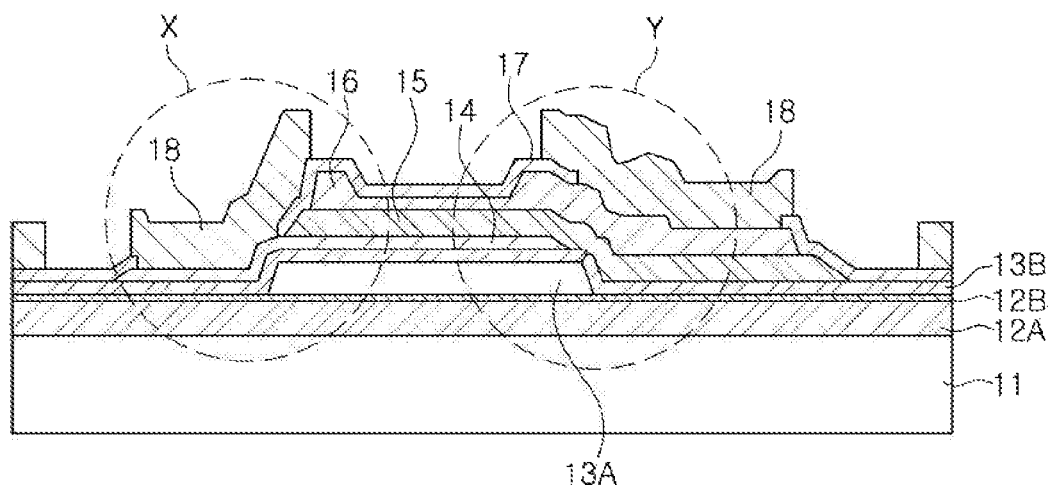
FIG. 1 is a cross-sectional view illustrating an example of a bulk acoustic wave resonator.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2A:
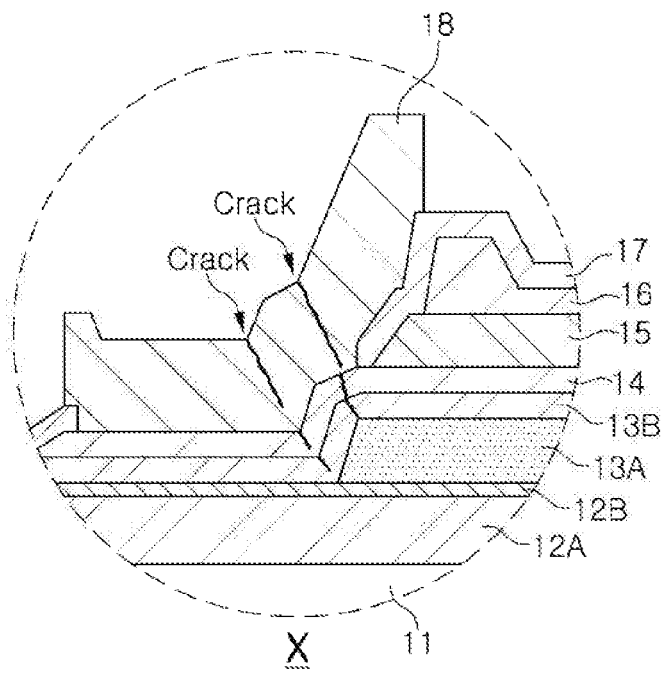
FIGS. 2A and 2B are partial enlarged views of the bulk acoustic wave resonator of FIG.
Figure 2B:
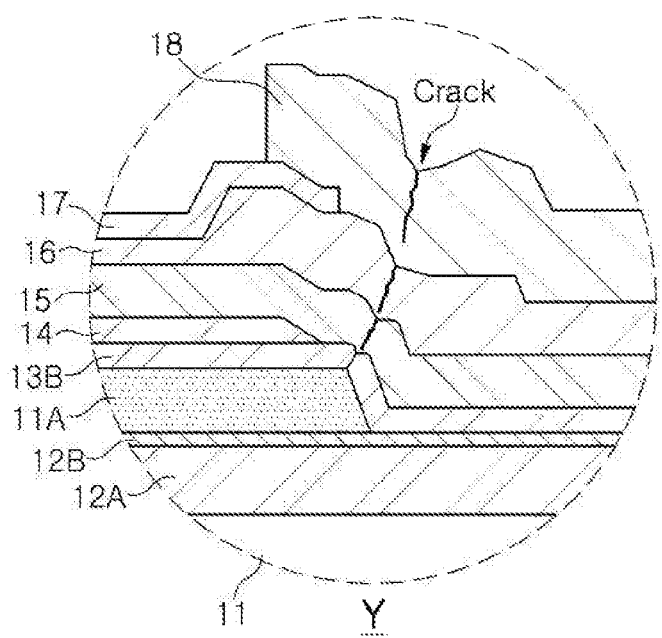

FIG. 1 is a cross-sectional view illustrating an example of a bulk acoustic wave resonator 10. FIGS. 2A and 2B are partial enlarged views of the bulk acoustic wave resonator 10. Referring to FIG. 1, the bulk acoustic wave resonator 10 includes a substrate 11, an insulating layer 12A electrically isolating the substrate 11, an etching stop layer 12B protecting the insulating layer 12A from an etching process, an air cavity 13A formed on the etching stop layer 12B, a membrane 13B formed to cover the air cavity 13A, as well as a lower electrode 14, a piezoelectric layer 15, and an upper electrode 16, which are sequentially stacked on the membrane 13B. In addition, the bulk acoustic wave resonator includes a protecting layer 17 preventing the upper electrode 16 from being exposed to the outside environment, and an electrode pad 18 for applying an electrical signal to the lower electrode 14 and the upper electrode 16.

The air cavity 13A is disposed below a resonating part including the lower electrode 14, the piezoelectric layer 15, and the upper electrode 16, so that the resonating part may vibrate in a predetermined direction. The air cavity 13A may be formed by an etching process including forming a sacrificial layer on the etching stop layer 12B, forming the membrane 13B on the sacrificial layer, and then etching and removing the sacrificial layer.

The air cavity 13A may be formed in an approximately trapezoidal shape. Referring to FIGS. 2A and 2B, cracks may form in the lower electrode 14, the piezoelectric layer 15, the upper electrode 16, and the electrode pad 18, which are stacked on the membrane 13B, due to a height of the air cavity 13A and an angle of a side of the air cavity 13A. Additionally, a crystal of the piezoelectric layer 15 which is stacked on the membrane 13B may be abnormally grown. Deterioration of insertion loss characteristics and attenuation characteristics of the bulk acoustic wave resonator 10 may occur as a result of the cracks and the abnormal crystal growth.

According to an embodiment, a step portion of the air cavity is removed by forming an etching stop part and a sacrificial layer pattern outside of the air cavity, and the resonating part is disposed on a flat surface from which the step portion has been removed, such that insertion loss characteristics and attenuation characteristics of the bulk acoustic wave resonator 10 may be improved.

Figure 3:
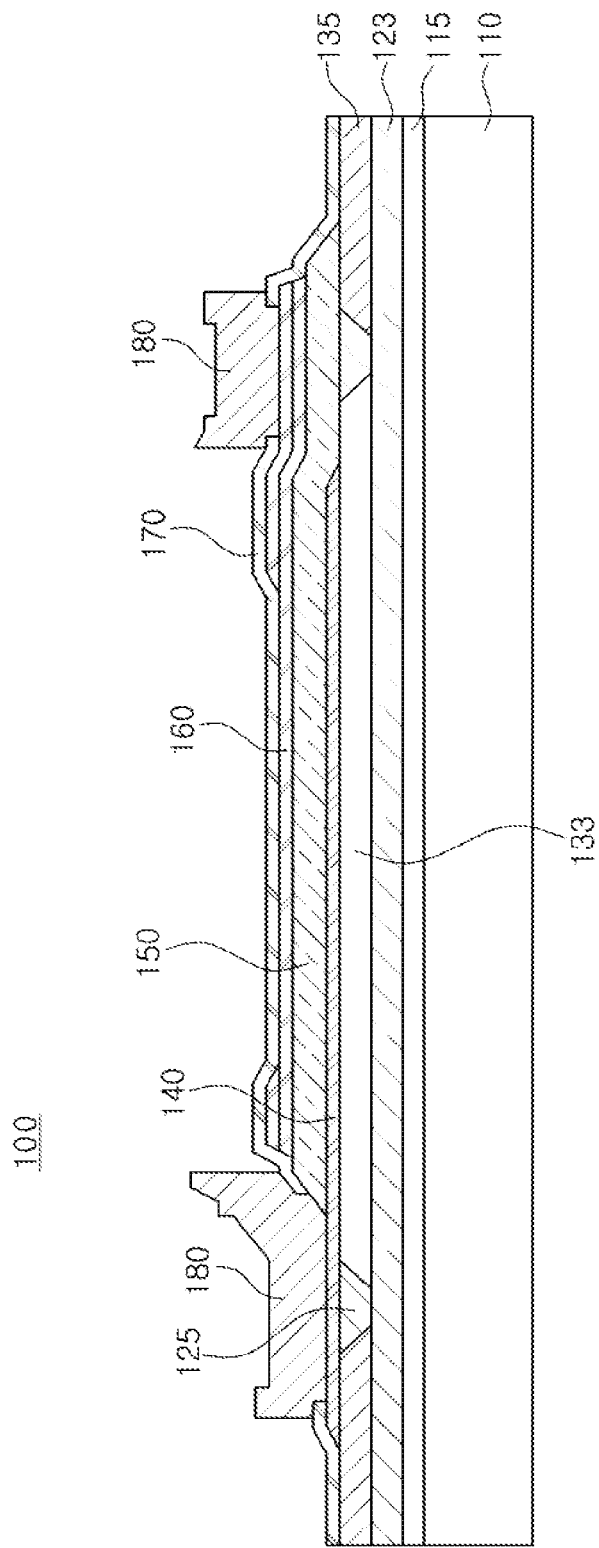
FIG. 3 is a cross-sectional view illustrating a bulk acoustic wave resonator, according to an embodiment.

FIG. 3 is a cross-sectional view illustrating a bulk acoustic wave resonator 100, according to an embodiment. The bulk acoustic wave resonator 100 is, for example, a film bulk acoustic resonator (FBAR).

Referring to FIG. 3, the bulk acoustic wave resonator 100 includes a substrate 110, an insulating layer 115, an etching stop layer 123, an etching stop part 125, an air cavity 133, a sacrificial layer pattern 135, and a resonating part including a first electrode 140, a piezoelectric layer 150, and a second electrode 160. The bulk acoustic wave resonator 100 further includes a protecting layer 170 and an electrode pad 180.

The substrate 110 may be formed of a silicon substrate, and the insulating layer 115, which electrically isolates the resonating part from the substrate 110, is formed on a top surface of the substrate 110. The insulating layer 115 may be formed on the substrate 110 by performing chemical vapor deposition, an RF magnetron sputtering, or evaporation for silicon dioxide ($SiO_2$) or aluminum oxide ($Al_2O_2$).

The etching stop layer 123 is formed on the insulating layer 115. The etching stop layer 123 protects the substrate 110 and the insulating layer 115 from an etching process, and serves as a base for depositing layers or films on the etching stop layer 123.

The etching stop part 125, the air cavity 133, and the sacrificial layer pattern 135 are formed on the etching stop layer 123. Since the etching stop part 125, the air cavity 133, and the sacrificial layer pattern 135 are formed on the etching stop layer 123 to be of the same height as one another, one surface (e.g. a top surface on which additional layers or films are stacked) of the etching stop part 125, the air cavity 133, and the sacrificial layer pattern 135 are approximately (e.g., substantially) planar.

The air cavity 133 is disposed, for example, below the resonating part so that the resonating part, including the first electrode 140, the piezoelectric layer 150, and the second electrode 160, may vibrate in a predetermined direction. The air cavity 133 may be formed by an etching process including forming a sacrificial layer on the etching stop layer 123, stacking the first electrode 140, the piezoelectric layer 150, and the second electrode 160 on the sacrificial layer, and then etching and partially removing the sacrificial layer.

The etching stop part 125 is formed outside of the air cavity 133. The etching stop part 125 is formed in a shape which protrudes from the etching stop layer 123, and thus a side boundary surface of the air cavity 133 is defined by a side surface of the etching stop part 125. A cross section of the etching stop part 125 may have an approximately (e.g., substantially) trapezoidal shape. Specifically, a width of a top surface of the etching stop part 125 may be greater than a width of a bottom surface of the etching stop part 125, and a side surface of the etching stop part 125 connecting the top surface of the etching stop part 125 and the bottom surface of the etching stop part 125 to each other may be inclined.

The etching stop layer 123 and the etching stop part 125 may be formed of a material which is not etched in the etching process for partially removing the sacrificial layer. In an example, the etching stop layer 123 and the etching stop part 125 are formed of the same material. The shape of the air cavity 133 after partially removing the sacrificial layer is defined by a space surrounded by the etching stop layer 123 and the etching stop part 125. Specifically, for example, a lower boundary surface of the air cavity 133 is defined by the etching stop layer 123, and the side boundary surface of the air cavity 133 is defined by the etching stop part 125.

The sacrificial layer pattern 135 is formed outside of the etching stop part 125, that is, on the other side of the etching stop part 125 in relation to the air cavity 133. The sacrificial layer pattern 135 remains after the etching process to partially remove the sacrificial layer formed on the etching stop layer 123.

A common region, in which the first electrode 140, the piezoelectric layer 150, and the second electrode 160 overlap each other in a vertical direction, is disposed over the air cavity 133.

The first electrode 140 and the second electrode 160 may be formed of any one or an alloy including any one or more of gold (Au), titanium (Ti), tantalum (Ta), molybdenum (Mo), ruthenium (Ru), platinum (Pt), tungsten (W), aluminum (Al), and nickel (Ni). The piezoelectric layer 150, which is a part causing a piezoelectric effect which converts electric energy into mechanical energy of an acoustic wave type, may be formed of any one of aluminum nitride (AlN), zinc oxide (ZnO), and lead zirconium titanium oxide (PZT; $PbZrTiO$). In addition, the piezoelectric layer 150 may further include a rare earth metal. As an example, the rare earth metal includes any one or any combination of any two or more of scandium (Sc), erbium (Er), yttrium (Y), and lanthanum (La). The piezoelectric layer 150 may include the rare earth metal in an amount of 1 to 20 at %.

The resonating part is partitioned into an active region and an inactive region. The active region of the resonating part, which is a region that is caused to vibrate and resonate in a predetermined direction by the piezoelectric phenomenon occurring in the piezoelectric layer 150 when electric energy, such as a radio frequency (RF) signal, is applied to the first electrode 140 and the second electrode 160, corresponds to a region in which the first electrode 140, the piezoelectric layer 150, and the second electrode 160 overlap each other in a vertical direction over the air cavity 133. The inactive region of the resonating part, which is a region which is not caused to resonate by the piezoelectric phenomenon even when the electric energy is applied to the first electrode 140 and the second electrode 160, is an outer region of the resonating part disposed outside of the active region.

The resonating part outputs the RF signal having a specific frequency using the piezoelectric phenomenon. Specifically, the resonating part outputs the RF signal having a resonance frequency corresponding to the vibration according to the piezoelectric phenomenon of the piezoelectric layer 150.

The protecting layer 170 is disposed on the second electrode 160 to prevent the second electrode 160 from being externally exposed. The protecting layer 170 may be formed of one of a silicon oxide-based insulating material, a silicon nitride-based insulating material, and an aluminum nitride-based insulating material. The electrode pad 180, for applying the electrical signal to the first electrode 140 and the second electrode 160, is formed on the first electrode 140 and the second electrode 160, which are both externally exposed.

FIGS. 4A through 4E are process diagrams of a method of manufacturing the bulk acoustic wave resonator 100, according to an embodiment.

Figure 4A:
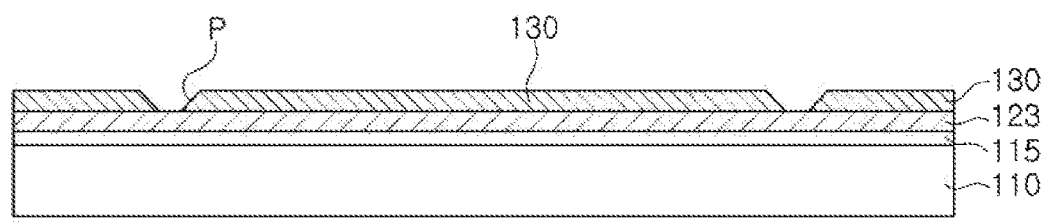
FIGS. 4A through 4E are process diagrams illustrating a method of manufacturing the bulk acoustic wave resonator of FIG. 3, according to an embodiment.

Referring to FIGS. 4A through 4E, in initial operations of the method of manufacturing the bulk acoustic wave resonator 100, the substrate 110, the insulating layer 115, the etching stop layer 123, and the sacrificial layer 130 are formed, and the pattern P is formed in the sacrificial layer 130 so that a portion of the etching stop layer 123 is exposed (FIG. 4A). A width of a top surface of the pattern P formed in the sacrificial layer 130 may be greater than a width of a bottom surface of the pattern P, and a side surface of the pattern P connecting the top surface of the pattern P and the bottom surface of the pattern P to each other may be inclined.

Figure 4B:
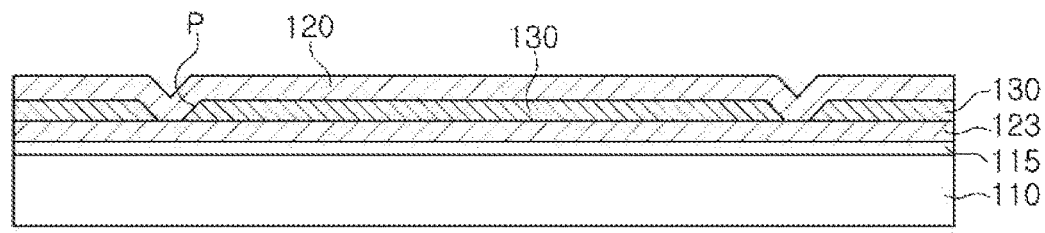

After the pattern P is formed in the sacrificial layer 130, an etching stop material 120 is formed to cover the sacrificial layer 130 and the etching stop layer 123, which is externally exposed by the pattern P (FIG. 4B). A thickness of a section of the etching stop material 120 filled in the pattern P may be greater than a thickness of the sacrificial layer 130. The etching stop layer 123 and the etching stop material 120 may be formed of the same material.

Figure 4C:
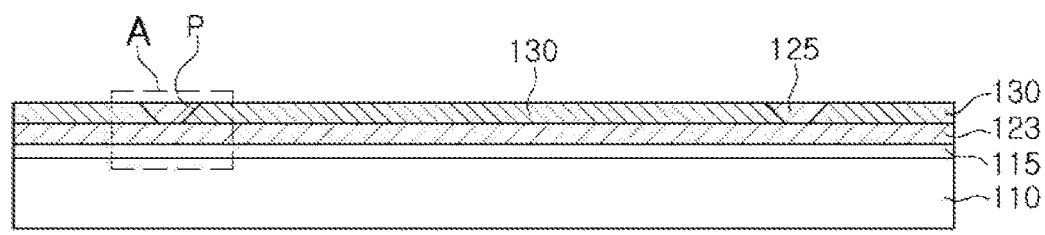
Figure 4D:
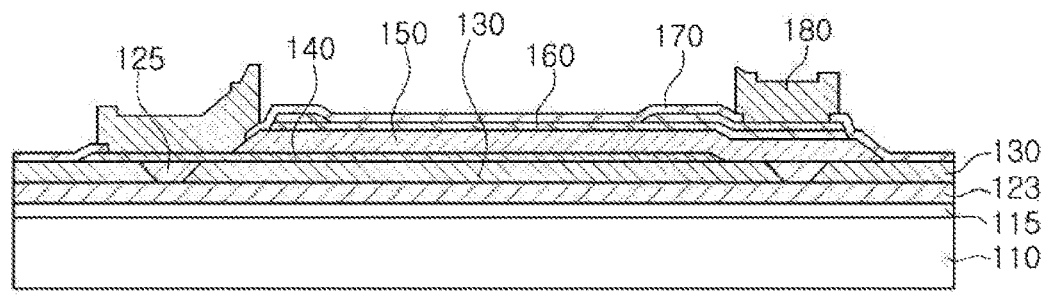

After the etching stop material 120 is formed, one surface of the etching stop material 120 is planarized so that the sacrificial layer 130 is externally exposed (FIG. 4C). A portion (e.g., a top portion) of the etching stop material 120 is removed in the operation of planarizing the one surface of the etching stop material 120, and the etching stop part 125 is formed by a remainder of the etching stop material 120 remaining in the pattern P after the portion of the etching stop material 120 is removed. The one surface of the etching stop part 125 and the sacrificial layer 130 may be approximately planarized through the operation of planarizing the etching stop material 120 such that the etching stop part 125 has the same height as the sacrificial layer 130.

Figure 5:
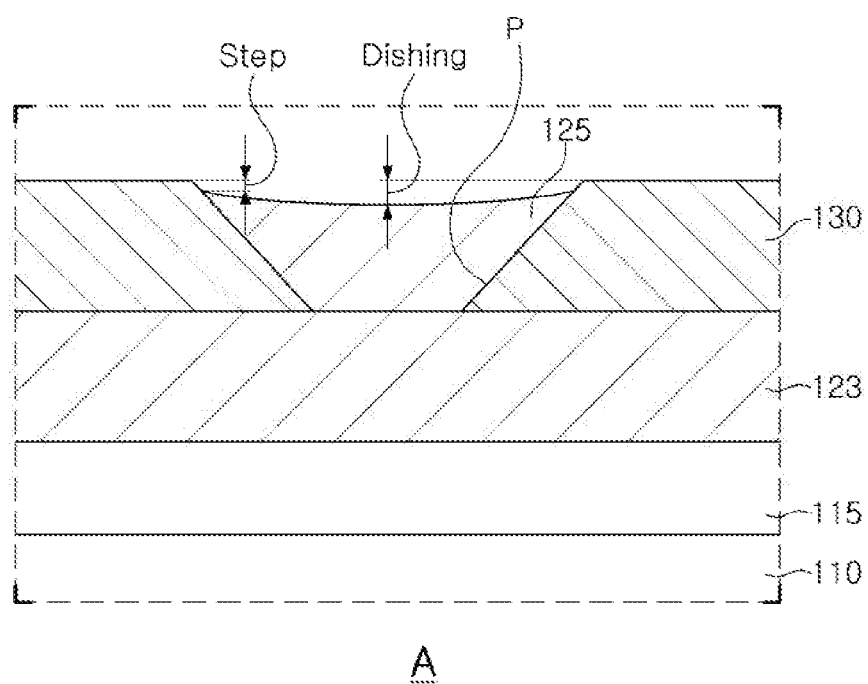
FIG. 5 is a partial enlarged view of part A of FIG. 4C.

FIG. 5 is a partial enlarged view of part A of FIG. 4C. Referring to FIG. 5, a step may be formed at a boundary between the remainder of the etching stop part 125 remaining after the portion of the etching stop material 120 is removed and the sacrificial layer 130, and a dishing phenomenon in which a thickness of the etching stop part 125 is smaller at the center of the etching stop part 125 than at edges of the etching stop part 125 may occur.

According to an embodiment, an occurrence of an abrupt step at the boundary between the etching stop part 125 and the sacrificial layer 130 may be prevented by forming side surfaces of the pattern P, in which the etching stop part 125 is formed, to be inclined, and the occurrence of the dishing phenomenon may be prevented by forming the width of the bottom surface of the pattern P to be narrow. As an example, an angle formed by the bottom surface and the side surface of the pattern P is 110° to 160°, and the width of the bottom surface of the pattern P is 2 μm to 30 μm.

Referring again to FIGS. 4A through 4E, after the portion of the etching stop material 120 is removed, the first electrode 140, the piezoelectric layer 150, and the second electrode 160 are sequentially stacked on the etching stop part 125 and the sacrificial layer 130, the protecting layer 170 is disposed on the second electrode 160, and the electrode pad 180, for applying the electrical signal to the first electrode 140 and the second electrode 160, is formed on the first electrode 140 and the second electrode 160, which are externally exposed (FIG. 4D).

Figure 4E:
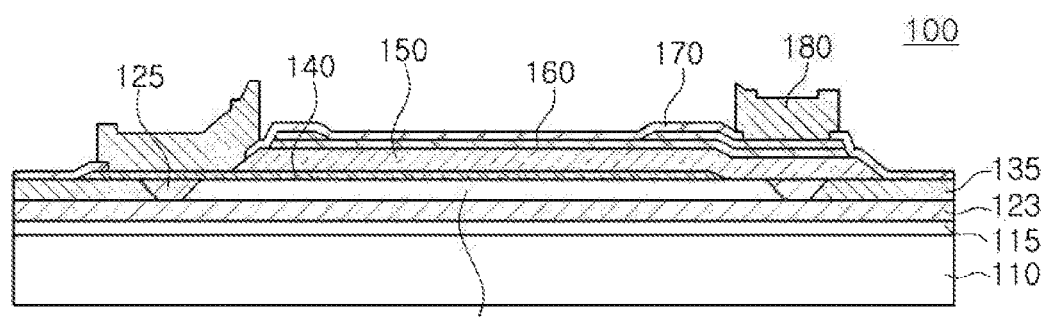

Thereafter, a portion of the sacrificial layer 130 disposed on the inside of the etching stop part 125 is removed by the etching process to form the air cavity 133, and a portion of the sacrificial layer 130 disposed on the outside of the etching stop part 125 remains as the sacrificial layer pattern 135 (FIG. 4E).

Figure 6:
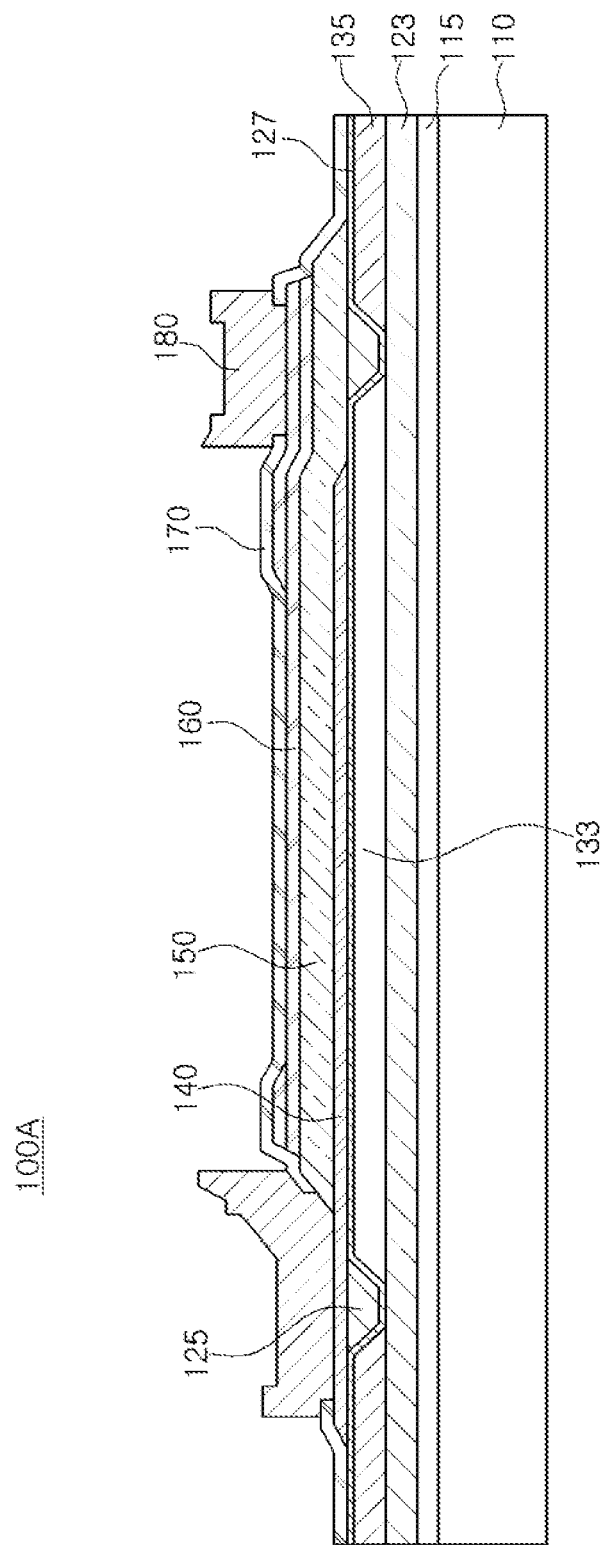
FIG. 6 is a view illustrating a bulk acoustic wave resonator, according to another embodiment.

FIG. 6 is a view illustrating a bulk acoustic wave resonator 100A, according to another embodiment.

Referring to FIG. 6, since the bulk acoustic wave resonator 100A is similar to the bulk acoustic wave resonator 100 according to the embodiment of FIG. 3, the same or overlapping descriptions will be omitted, and the description of the bulk acoustic wave resonator 100A will focus on differences with respect to the bulk acoustic wave resonator 100.

Referring to FIG. 6, the bulk acoustic wave resonator 100A further includes a membrane 127, as compared to the bulk acoustic wave resonator 100. The membrane 127 is formed on side and a bottom surfaces of the etching stop part 125, an upper boundary surface of the air cavity 133, and a top surface of the sacrificial layer pattern 135, to adjust stress of the bulk acoustic wave resonator 100A. A thickness of the membrane 127 may be less than the thickness of the air cavity 133.

FIGS. 7A through 7F are process diagrams of a method of manufacturing the bulk acoustic wave resonator 100A, according to an embodiment.

Figure 7A:
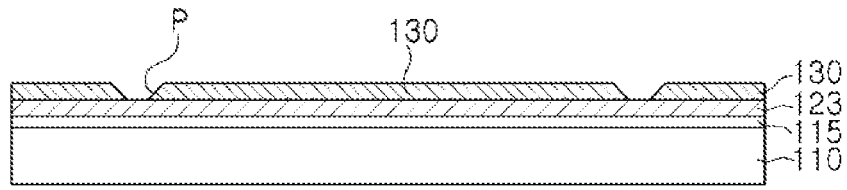
FIGS. 7A through 7F are process diagrams illustrating a method of manufacturing the bulk acoustic wave resonator of FIG. 6, according to an embodiment.

Referring to FIGS. 7A through 7F, in initial operations of the method of manufacturing the bulk acoustic wave resonator 100A, the substrate 110, the insulating layer 115, the etching stop layer 123, and the sacrificial layer 130 are formed, and the pattern P is formed in the sacrificial layer 130 so that the portion of the etching stop layer 123 is exposed (FIG. 7A). A width of a top surface of the pattern P formed in the sacrificial layer 130 may be greater than a width of a bottom surface of the pattern P, and a side surface of the pattern P connecting the top surface of the pattern P and the bottom surface of the pattern P to each other may be inclined.

Figure 7B:
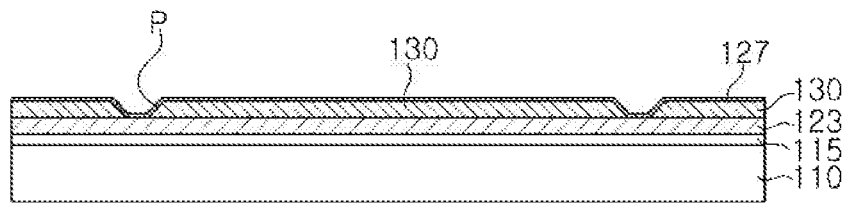

After the pattern P is formed in the sacrificial layer 130, the membrane 127 is formed on the sacrificial layer 130 and the portion of the etching stop layer 123 which is externally exposed by the pattern P (FIG. 7B). The membrane 127 may have a predetermined thickness on the sacrificial layer 130 and the etching stop layer 123, and the thickness of the membrane 127 may be less than the thickness of the sacrificial layer 130.

Figure 7C:
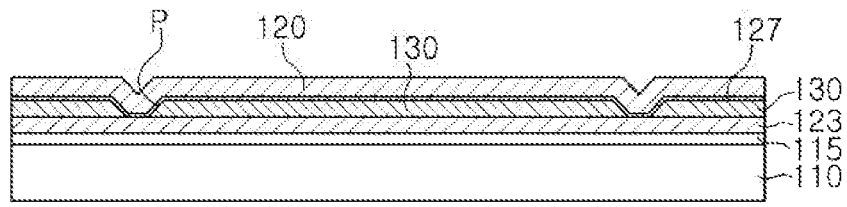

After the membrane 127 is formed, the etching stop material 120 is formed to cover the membrane 127 (FIG. 7C). A thickness of a section of the etching stop material 120 filled in the pattern P may be greater than a thickness of the sacrificial layer 130. The etching stop layer 123 and the etching stop material 120 may be formed of the same material.

Figure 7D:
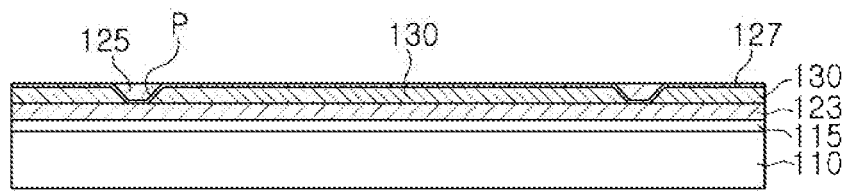

After the etching stop material 120 is formed, one surface of the etching stop material 120 is planarized so that the membrane 127 formed on the top surface of the sacrificial layer 130 is externally exposed (FIG. 7D). A portion (e.g., a top portion) of the etching stop material 120 is removed during the operation of planarizing the one surface of the etching stop material 120, and the etching stop part 125 is formed by a remainder of the etching stop material 120 remaining in the pattern P after the portion of the etching stop material 120 is removed. One surface of the etching stop part 125 and the sacrificial layer 130 may be approximately (e.g., substantially) planarized through the operation of planarizing the etching stop material 120 such that the etching stop part 125 has the same height as the sacrificial layer 130. Here, the membrane 127 may serve as a stop layer of the process of planarizing the etching stop material 120.

Figure 7E:
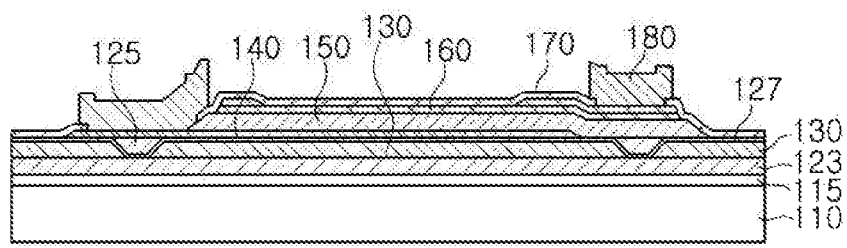

After the portion of the etching stop material 120 is removed, the first electrode 140, the piezoelectric layer 150, and the second electrode 160 are sequentially stacked on the top surfaces of the etching stop part 125 and the membrane 127, the protecting layer 170 is disposed on the second electrode 160, and the electrode pad 180, for applying the electrical signal to the first electrode 140 and the second electrode 160, is formed on the first electrode 140 and the second electrode 160, which are externally exposed (FIG. 7E).

Figure 7F:
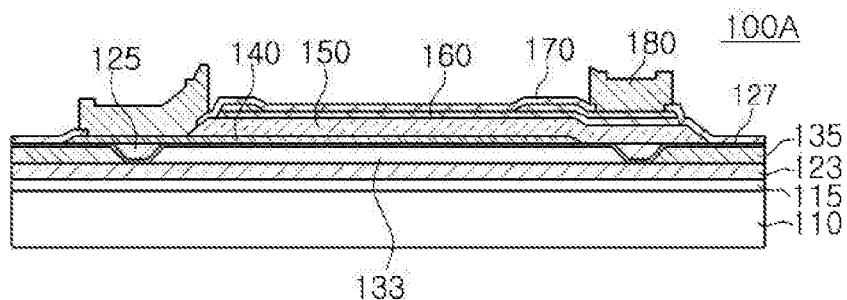

Thereafter, a portion of the sacrificial layer 130 disposed on the inside of the etching stop part 125 is removed by the etching process to form the air cavity 133, and a portion of the sacrificial layer 130 disposed on the outside of the etching stop part 125 remains as the sacrificial layer pattern 135 (FIG. 7F).

Figure 8:
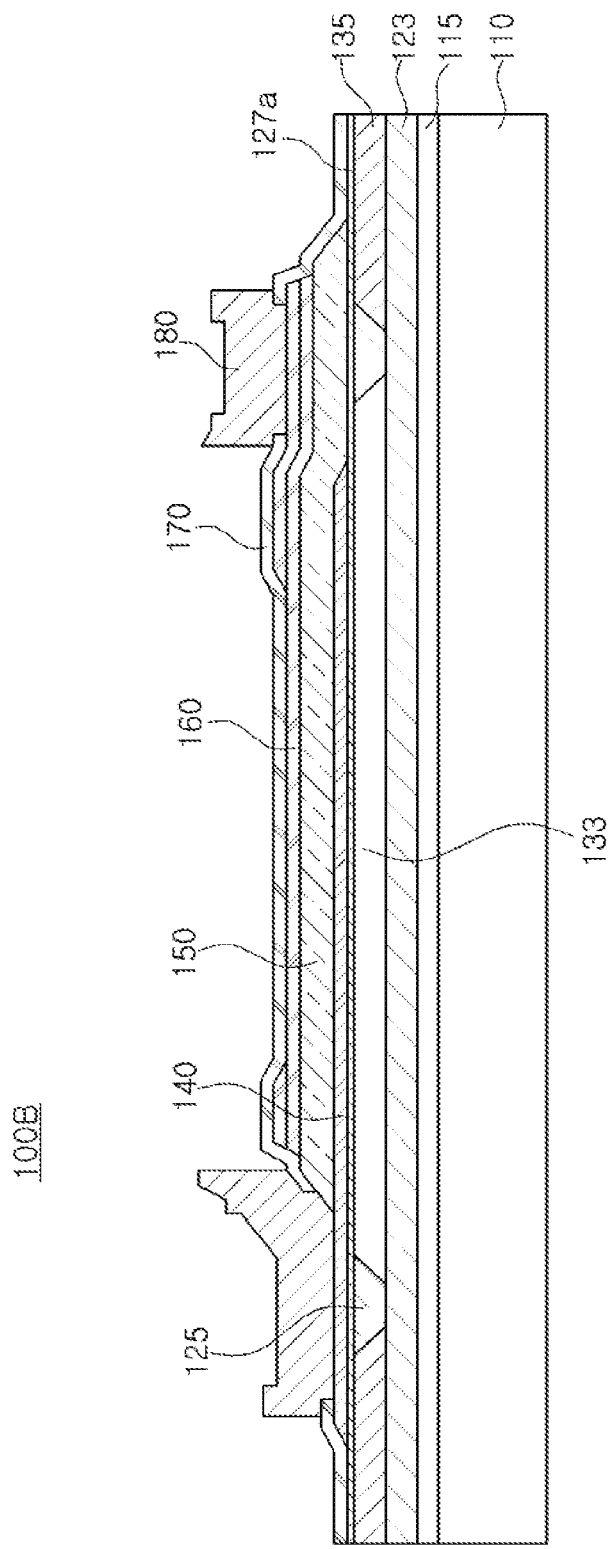
FIG. 8 is a view illustrating a bulk acoustic wave resonator, according to another embodiment.

FIG. 8 is a view illustrating a bulk acoustic wave resonator 100B, according to another embodiment.

Referring to FIG. 8, since the bulk acoustic wave resonator 100B is similar to the bulk acoustic wave resonator 100 according to the embodiment of FIG. 3, the same or overlapping descriptions will be omitted, and the description of the bulk acoustic wave resonator 100B will focus on differences with respect to the bulk acoustic wave resonator 100.

Referring to FIG. 8, the bulk acoustic wave resonator 100B further includes a membrane 127a, as compared to the bulk acoustic wave resonator 100. The membrane 127a is formed on the one surface of the etching stop part 125, the air cavity 133, and the sacrificial layer pattern 135 which is formed to be approximately (e.g., substantially) planar by the etching stop part 125, the air cavity 133, and the sacrificial layer pattern 135, to adjust stress of the bulk acoustic wave resonator 100B.

FIGS. 9A through 9F are process diagrams of a method of manufacturing the bulk acoustic wave resonator 100B, according to an embodiment.

Figure 9A:
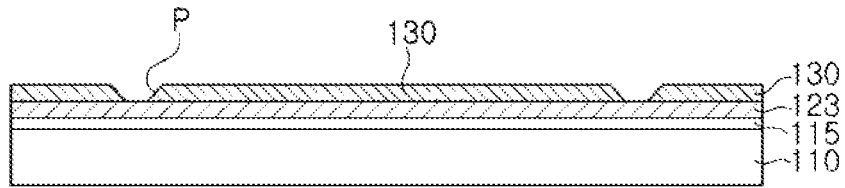
FIGS. 9A through 9F are process diagrams illustrating a method of manufacturing the bulk acoustic wave resonator of FIG. 8, according to an embodiment.

Referring to FIGS. 9A through 9F, in initial operations of the method of manufacturing the bulk acoustic wave resonator 100B, the substrate 110, the insulating layer 115, the etching stop layer 123, and the sacrificial layer 130 are formed, and the pattern P is formed in the sacrificial layer 130 so that a portion of the etching stop layer 123 is exposed (FIG. 9A). A width of a top surface of the pattern P formed in the sacrificial layer 130 may be greater than a width of a bottom surface thereof, and a side surface of the pattern P connecting the top surface of the pattern P and the bottom surface of the pattern P to each other may be inclined.

Figure 9B:
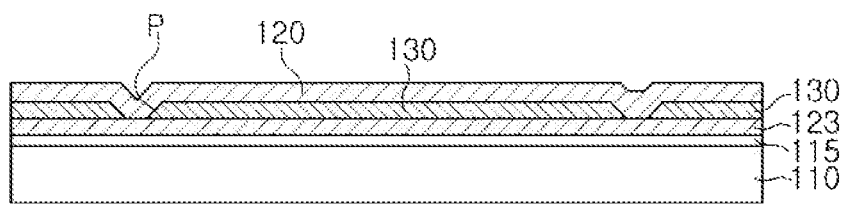

After the pattern P is formed in the sacrificial layer 130, the etching stop material 120 is formed to cover the sacrificial layer 130 and the etching stop layer 123, which is externally exposed by the pattern P (FIG. 9B). A thickness of a section of the etching stop material 120 filled in the pattern P may be greater than a thickness of the sacrificial layer 130. The etching stop layer 123 and the etching stop material 120 may be formed of the same material.

Figure 9C:
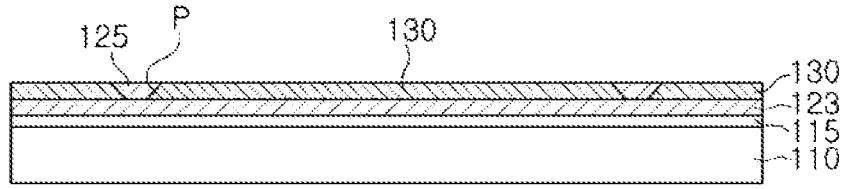

After the etching stop material 120 is formed, one surface of the etching stop material 120 is planarized so that the sacrificial layer 130 is externally exposed (FIG. 9C). A portion (e.g., a top portion) of the etching stop material 120 is removed in the operation of planarizing the one surface of the etching stop material 120, and the etching stop part 125 is formed by a remainder of the etching stop material 120 remaining in the pattern P after the portion of the etching stop material 120 is removed. One surface (e.g., a top surface) of the etching stop part 125 and the sacrificial layer 130 is approximately (e.g., substantially) planarized through the operation of planarizing the etching stop material 120 such that the etching stop part 125 has the same height as the sacrificial layer 130.

Figure 9D:
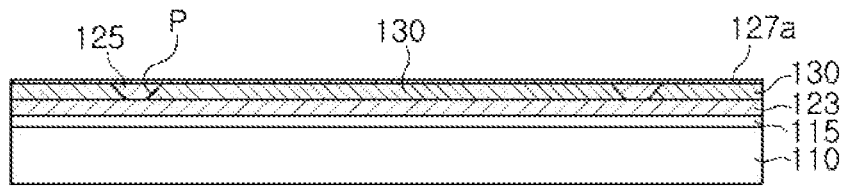

After the portion of the etching stop material 120 is removed, the membrane 127a is formed on the one surface of etching stop part 125 and the sacrificial layer 130 (FIG. 9D).

Figure 9E:
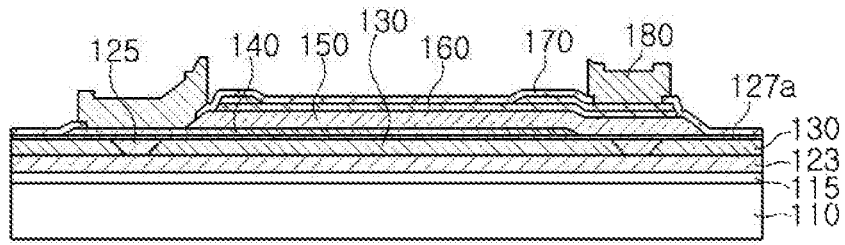

After the membrane 127 is formed, the first electrode 140, the piezoelectric layer 150, and the second electrode 160 are sequentially stacked on the membrane 127a, the protecting layer 170 is disposed on the second electrode 160, and the electrode pad 180 for applying the electrical signal to the first electrode 140 and the second electrode 160 is formed on the first electrode 140 and the second electrode 160, which are externally exposed (FIG. 9E).

Figure 9F:
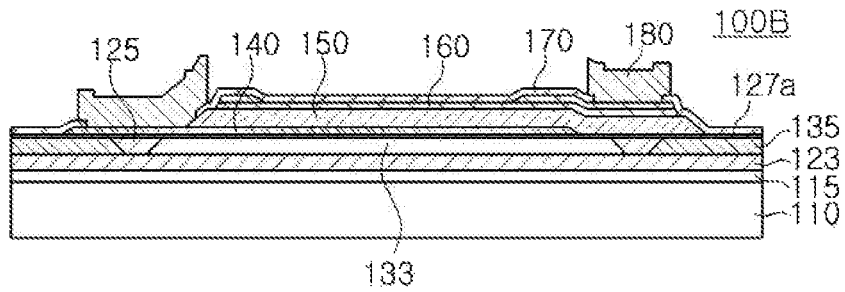

Thereafter, a portion of the sacrificial layer 130 disposed on the inside of the etching stop part 125 is removed by the etching process to form the air cavity 133, and a portion of the sacrificial layer 130 disposed on the outside of the etching stop part 125 remains as the sacrificial layer pattern 135 (FIG. 9F).

Figure 10:
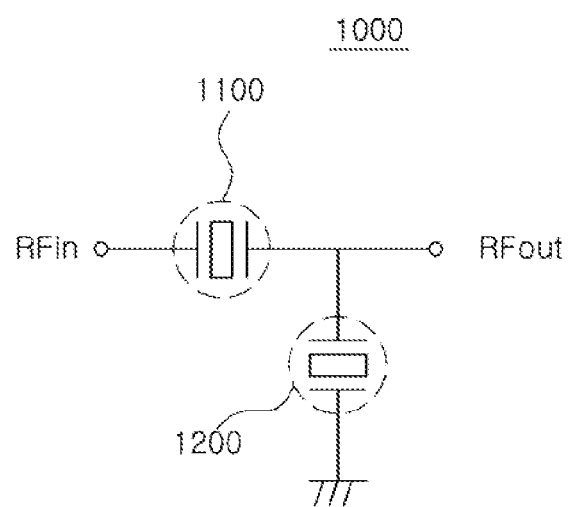
FIGS. 10 and 11 are schematic circuit diagrams of filters, according to embodiments.
Figure 11:
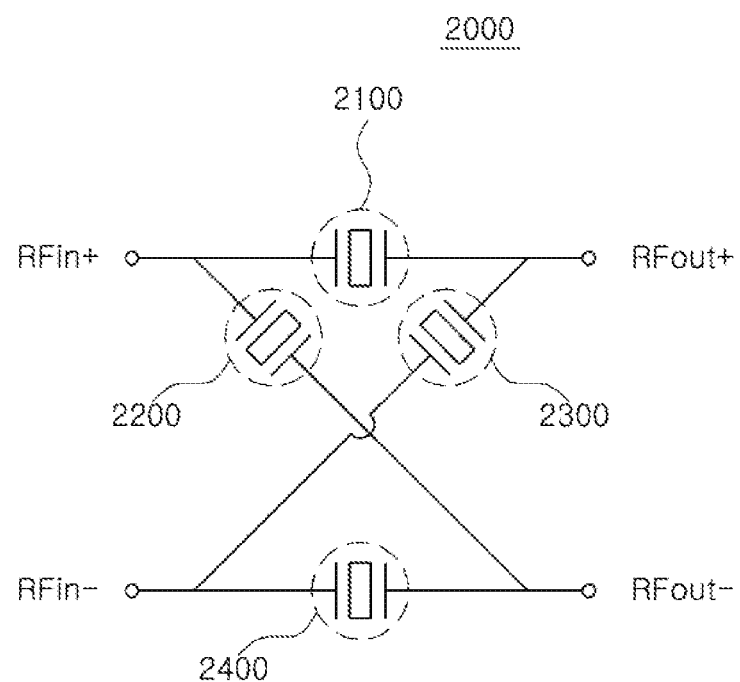

FIGS. 10 and 11 are schematic circuit diagrams of filters, according to embodiments. Each of the bulk acoustic wave resonators employed in the filters of FIGS. 10 and 11 may correspond to a bulk acoustic wave resonator illustrated in FIG. 3, FIG. 6, or FIG. 8.

Referring to FIG. 10, a filter 1000, according to an embodiment, is formed in a ladder-type filter structure. Specifically, for example, the filter 1000 includes first and second bulk acoustic wave resonators 1100 and 1200. The first bulk acoustic wave resonator 1100 is connected in series between a signal input terminal, to which an input signal RFin is input, and a signal output terminal, from which an output signal RFout is output, and the second bulk acoustic wave resonator 1200 is connected between the signal output terminal and a ground.

Referring to FIG. 11, a filter 2000, according to an embodiment, is formed in a lattice-type filter structure. Specifically, for example, the filter 2000 includes bulk acoustic wave resonators 2100, 2200, 2300, and 2400, to filter balanced input signals, RFin+ and RFin−, and output balanced output signals, RFout+ and RFout−.

As set forth above, according to the embodiments disclosed herein, a bulk acoustic wave resonator and a method for manufacturing a bulk acoustic wave resonator may prevent cracks from forming in a film or a layer stacked on a substrate, and may induce normal crystal growth.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator including:
   an air cavity;
   an etching stop layer and an etching stop part, which define a lower boundary surface and a side boundary surface of the air cavity; and
   a resonating part formed on an approximately planar surface, which is formed by an upper boundary surface of the air cavity and a top surface of the etching stop part,
   wherein a width of a top surface of the etching stop part is greater than a width of a bottom surface of the etching stop part, and
   wherein a side surface of the etching stop part connecting the top surface of the etching stop part to the bottom surface of the etching stop part is inclined.

2. The bulk acoustic wave resonator of claim 1, wherein the width of the bottom surface of the etching stop part is 2 µm to 30 µm.

3. The bulk acoustic wave resonator of claim 1, wherein an angle formed by the bottom surface of the etching stop part and the side surface of the etching stop part is 110° to 160°.

4. The bulk acoustic wave resonator of claim 1, further comprising a sacrificial layer pattern which is disposed outside the etching stop part.

5. The bulk acoustic wave resonator of claim 1, further comprising a membrane formed on the side surface and the bottom surface of the etching stop part, and on an upper boundary surface of the air cavity.

6. The bulk acoustic wave resonator of claim 5, wherein a thickness of the membrane is less than a thickness of the air cavity.

7. The bulk acoustic wave resonator of claim 1, further comprising a membrane formed on the top surface of the etching stop part, and on the upper boundary surface of the air cavity.

8. The bulk acoustic wave resonator of claim 1, wherein the etching stop layer and the etching stop part are formed of a same material.

9. The bulk acoustic wave resonator of claim 1, wherein:
   the resonating part comprises a first electrode, a piezoelectric layer, and a second electrode, which are sequentially formed; and
   the piezoelectric layer comprises a rare earth metal.

10. The bulk acoustic wave resonator of claim 9, wherein the rare earth metal comprises any one or any combination of any two or more of scandium(Sc), erbium(Er), yttrium (Y), and lanthanum(La).

11. The bulk acoustic wave resonator of claim 9, wherein the piezoelectric layer comprises the rare earth metal in an amount of 1 to 20 at %.

* * * * *